United States Patent [19]

Arita

[11] Patent Number: 4,740,710

[45] Date of Patent: Apr. 26, 1988

[54] PHOTO-DETECTOR APPARATUS FOR A READING APPARATUS AND PRODUCING METHOD THEREFOR

[75] Inventor: Hirotaka Arita, Kagoshima, Japan

[73] Assignee: Kyocera Corporation, Kyoto, Japan

[21] Appl. No.: 944,833

[22] Filed: Dec. 18, 1986

Related U.S. Application Data

[62] Division of Ser. No. 747,062, Jun. 20, 1985.

[30] Foreign Application Priority Data

Jun. 21, 1984 [JP] Japan ................ 59-128530
Jun. 11, 1985 [JP] Japan ................ 60-127499
Jun. 13, 1985 [JP] Japan ................ 60-129418

[51] Int. Cl.⁴ .................. H01L 27/14; H01L 31/00
[52] U.S. Cl. ................................ 250/578; 357/30
[58] Field of Search ................ 250/578, 211 J; 357/30–32; 358/212, 213

[56] References Cited

U.S. PATENT DOCUMENTS

| | | | |
|---|---|---|---|
| 3,504,114 | 3/1970 | Irwin et al. | 357/30 |
| 3,969,751 | 7/1976 | Drukaroff et al. | 357/30 |
| 4,441,791 | 4/1984 | Hornbeck | 357/30 |
| 4,458,260 | 7/1984 | McIntyre | 357/30 |

Primary Examiner—David C. Nelms
Assistant Examiner—Stephone B. Allen
Attorney, Agent, or Firm—Spensley Horn Jubas & Lubitz

[57] ABSTRACT

A reading apparatus including a plurality of photodiodes each provided with a storage capacitor, the photodiodes adapted to store electric charge in the storage capacitor upon receiving light, a plurality of analog switches each connected in series with one end of each of the photodiodes, an element for leading out an amount of electric charge as a signal when the amount of electric charge is stored in the storage capacitor, a shift register for rendering the plurality of analog switches conductive successively in time sequence, wherein capacitance of the storage capacitor is larger than parasitic capacitance of the analog switch.

13 Claims, 12 Drawing Sheets

PHOTO-DETECTOR APPARATUS FOR A READING APPARATUS AND PRODUCING METHOD THEREFOR

This is a division of application Ser. No. 747,062, filed on June 20, 1985.

BACKGROUND OF THE INVENTION

1. Field of the Invention

The present invention relates to a reading apparatus such as an image sensor of contact-type adapted such that photoelectric converter element array is arranged therein which virtually corresponds to an original document in a dimension of 1:1 and relates to a producing method therefor, aiming for miniaturization of, for example a facsimile apparatus.

2. Description of the Prior Art

In such an apparatus, it is desired that the degree of clarity (contrast) and reproducibility of the reading image be both improved to effect a faithful reading of the image. Furthermore the improvement in the productivity of such reading apparatus is desired. However, the prior art has fail to sufficiently make improvements in the degree of clarity (contrast), the reproducibility, and the productivity.

Of late, development of a facsimile apparatus of contact-type has become active. For such apparatus, it has been proposed to present such various types as that detecting the light reflected from an original document through a focusing rod lense array, or that effecting the excellent light-transmittivity and the miniaturization without such array.

FIG. 1 is a perspective view showing a photodetection part 2 of the reading apparatus of the prior art employing the focusing rod lense array. On a substrate 5, there are formed a common electrode 6 to be one electrode commonly for each photoelectric converter element, a photoconductor 7, and transparent electrodes 8 successively in this order as shown in FIG. 1. Additionally light-excluding metal layers 9 are applied on the transparent electrodes 8 except on light-introduction portions 10 for reflected light A. A transparent protective layer 11 made of $SiO_2$ etc is so applied as to cover the common electrode 6, photoconductor 7, transparent electrodes 8, and light-excluding metal layers 9. A drive circuit part 12 such as a shift register is also provided on the substrate 5.

According to such conventional apparatus, the reflected light A from an original document 1 is passed through the transparent protective light 11 and is received by the light-introduction portions 10, and then reading picture elements corresponding to the individual light-introduction portions 10 are produced.

However, the transparent protective layer 11 made of $SiO_2$ is formed by means of sputtering method, or by applying alkoxide solution and heating the thus applied solution at approximately 400° to 500° C. in the above conventional apparatus, which leads to production of plasma or a temperature rise. Such severe layer-forming conditions reduce the quality of exposed portions of the photoconductor 7 made of amorphous silicon or the like which has already been formed. It has been found that dark current is remarkably increased to deteriorate the S/N ratio consequently.

FIG. 2 shows a partial section taken along the line II—II of FIG. 1. As understood from FIG. 2, of the photoconductor 7, both portions 7a intervening between elements and portions 7b in the vicinity of the light-excluding metal 9 are also irradiated with light. As a result, the intervening portions 7a decrease in resistance value to produce leakage current among the adjoining elements. Hence, the reading picture element decreases in clarity. In addition, the portions 7b decrease in resistant value to produce leakage current between the electrodes 6 and 8. It has been found that dark current extremely increases to deteriorate the S/N ratio consequently.

FIG. 3 shows another type of the photo-detection part 2 of the prior art. On a light-transmitting substrate 13, there are formed a light-excluding metal layer 15 having formed therein light-passing holes 14 for passing the reflected light C from the original document 1, a light-transmitting electrically insulative layer 16, light-transmitting individual electrodes 17 provided in the respective photoelectric converter elements, a photoconductor 18, and a common electrode 19 to be one electrode commonly for each photoelectric converter element, successively in this order, as shown in FIG. 3. Also in the photo-detection part 2 of this type is provided a drive circuit 20.

According to this conventional apparatus, the light C reflected from the original document 1 comes from the side of the light-transmitting substrate 13, and is passed through the light-passing holes 14 corresponding to the respective photoelectric converter elements. Then, photocurrent is produced in the photoconductor 18, thus resulting in reading picture elements.

According to a process of producing this apparatus, however, there are to be formed on the light-transmitting substrate 13, the light-excluding metal layer 15 normally made of Al, Cr, or the like by means of vacuum vapor deposition, the light-transmitting electrically insulative layer 16 made of $SiO_2$ or the like by means of sputtering method, the light-transmitting individual electrodes 17 made of ITO (tin-indium oxide) or the like by means of vacuum vapor desposition method, the amorphous silicon photoconductor 18 by means of glow discharging method, and the common electrode 19 made of Al, Cr, and the like by means of vacuum vapor deposition method, successively in this order. Accordingly, it is impossible to form two layer of these five layers 15, 16, 17, 18 and 19 successively by means of the same thin film forming technique. Therefore, in order to form these layers it is required to use the suitable thin film forming apparatus depending on the layer to be formed. On the contrary, it is desirable to form at least two layers by a series of process of the same thin film forming technique in the light of the shrinkage of the required time or the improvement on the efficiency of the process.

Besides, there is a possibility that a short takes place between the light-exceeding metal layer 15 and the light-transmitting individual electrodes 17 when pinholes are produced in the light-transmitting electrically insulative layer 16. In consequence, such a problem is caused that the individual electrode 17 is electrically connected with other electrodes 17 via the light-excluding metal layer 15, thereby preventing the accurate reading picture elements from appearing and thus lacking in the reliability.

SUMMARY OF THE INVENTION

The present inventor who made elaborate and strenuous studies and researches with a view to solve the aforementioned problems has reached a recognition that the degree of clarity (contrast) of a reading image can be improved when the ratio of the capacitance of a storage capacitor to the capacitance of an analog siwtch is determined to be specified one.

The present invention is based upon the above recognition. Accordingly, an objective of the present invention is to improve the degree of clarity and reproducibility of a reading image and thereby to present a reading apparatus capable of effecting a faithful image reading.

Moreover, the present inventor has reached another new recognition, based upon further elaborate studies and researches, that the storage capacitor which is made of the same material as that of photodiode can have the sufficient or satisfactory capacitor characteristic.

The present invention is also based upon the above recognition. Accordingly, a further objective of the invention is to provide a reading apparatus wherein the photodiode and the storage capacitor can be simultaneously formed of the same material and thereby the capacitor having the uniform characteristic can be formed without any specific or separate processes whatsoever, and thus the improvement in the producing efficiency is accomplished.

A yet further objective of the invention is to elevate the characteristics of both the photodiode and the storage capacitor so as to make improvements in the degree of clarity and reproducibility of a reading image and thereby a further present a reading apparatus capable of effectuating a faithful image reading.

A still further objective of the invention is to provide a reading apparatus wherein the producing procces thereof is simplified and reading picture elements with improved clarity accurately appear so as to ensure the high quality and great functional reliability thereof.

In order to accomplish the above objectives, a reading apparatus according to an aspect of the invention comprises: a plurality of photoelectric converter elements each provided with electric charge storage means, said photoelectric converter elements adapted to store electric charge in the electric charge storage means upon receiving light; a plurality of switches each connected in series with one end of each of the photoelectric converter elements; means for leading out an amount of electric charge as a signal when the amount of electric charge is stored in said electric charge storage means; means for rendering said plurality of switches conductive successively in time sequence; wherein capacitance of said electric charge storage means is larger than parasitic capacitance of said switch.

In a preferred embodiment, the ratio of capacitance C1 of said electric charge storage means to parasitic capacitance SC of said switch is determined as follows:

$$C1/SC > 1$$

In another preferred embodiment, the ratio of capacitance C1 of said electric charge storage means to parasitic capacitance SC of said switch is determined as follows:

$$C1/SC > 3$$

Hence, according to the present invention, there is provided a reading apparatus wherein a high output signal can be obtained, and the degree of clarity and reproducibility of a reading image can be improved, and thereby a faithful image reading can be attained.

Furthermore, according to the present invention, the use of the amorphous silicon photoconductor for the photodiode and the storage capacitor, which use facilitates to achieve the objectives of the invention, enables the reading apparatus to effect the production of the high output signal with reduced variation, as well as advantageously make improvements in the production effeciency thanks to the resulting integral formation of both the photodiode and the storage capacitor.

A reading apparatus according to a further aspect of the invention comprises: a plurality of photoelectric converter elements each provided with electric charge storage means, said photoelectric converter elements adapted to store electric charge in said electric charge storage means upon receiving light; a plurality of switches each connected in series with one end of each of the photoelectric converter elements; means for leading out an amount of electric charge as a signal when the amount of electric charge is stored in said electric charge storage means; means for rendering said plurality of switches conductive successively in time sequence, said electric charge storage means comprising a storage capacitor; said photoelectric converter element comprising a photodiode; wherein said storage capacitor and said photodiode are substantially integrally formed of amorphous silicon photoconductor and said amorphous silicon photoconductor comprises a p-i-n semiconductor.

In a further preferred embodiment, the film thickness of said amorphous silicon photoconductor is determined to be within the range of from 0.4 to 3.0 $\mu$m.

In a yet preferred embodiment, the film thickness of said amorphous silicon photoconductor is determined to be within the range of from 1.0 to 2.0 $\mu$m.

Preferably, the film thickness of said amorphous silicon photoconductor is determined to be approximately 1.5 $\mu$m.

Hence, according to the present invention, there is provided a reading apparatus wherein the photodiode and the storage capacitor can be simultaneously formed of the same material, and thereby not only the producing efficiency can be improved, but also the various characteristics of both the photodiode and the capacitor can be sufficiently exercised.

Moreover, according to the present invention, there is provided a reading aparatus wherein the p-i-n junction of the a-Si photoconductor effectively improves the characteristics of both the photodiode and the storage capacitor so that a faithful image reading is assured by the resultant improvement in the degree of clarity and reproducibility of a reading image.

A reading apparatus according to a yet further aspect of the invention comprises: photo-detection means, said photo-detection means comprising: a substrate having at least a surface thereof made of electrically insulative material; a common electrode made of light-transmitting material and formed on the substrate; a light-excluding metal layer made of light-excluding material, formed on the common electrode, and having light-passing holes formed therein such that the light-passing holes are arranged in one direction to adjoin to each other; a photoconductor formed on the light-excluding metal layer and on those portions of the common electrode which face the light-passing holes of the light-excluding metal layer; and individual electrodes so formed on the photo-conductor as to respectively correspond to the light-passing holes of the light-excluding metal layer; and optical means for forming an image of an original document onto the substrate.

A reading apparatus according to yet another aspect of the invention comprises photo-detection means, said photo-detection means comprising: a substrate having at least a surface thereof made of electrically insulative material; a light-excluding metal layer made of light-excluding material, formed on the substrate, and having light-passing holes formed therein such that the light-passing holes are arranged in one direction to adjoin to each other; a common electrode made of light-transmitting material, and formed on the light excluding metal layer and on those portions of the substrate which face the light-passing holes of the light-excluding metal layer; a photo-conductor formed on the common electrode; and individual electrodes so formed on the photoconductor as to respectively correspond to the light-passing holes of the light-excluding metal layer; and optical means for forming an image of an original document onto the substrate.

In another preferred embodiment, a protective layer is formed on the individual electrodes and on those portions of the photoconductor on which the individual electrodes are not formed.

In still another preferred embodiment, the substrate consists of glass.

In a yet further preferred embodiment, the common electrode consists of ITO (tin-indium oxide).

Preferably, the light-excluding metal layer is made of one selected from the group consisting of Al and Cr.

Besides preferably, the photoconductor is made of one selected from the group consisting of amorphous silicon and CdS.

Further preferably, the individual electrodes are made of at least one selected from the group consisting of Al and Cr.

Additionally preferably, the protective layer consists of synthetic resin material.

A method of producing a reading apparatus according to a further aspect of the invention, comprises: providing photo-detection means which comprises: a substrate having at least a surface thereof made of electrically insulative material; a common electrode made of light-transmitting material, said common electrode formed on the substrate; a light-excluding metal layer having light-passing holes formed therein, said light-excluding metal layer formed on the common electrode by means of vacuum vapor deposition method; a photoconductor formed on the light-excluding metal layer and on those portions of the common electrode which are exposed to the light-passing holes of the light-excluding metal layer; and individual electrodes formed on positions in the photoconductor corresponding to the light-passing holes of the light-excluding metal layer; and providing optical means for forming an image of an original document onto the photo-detection means.

A method of producing a reading apparatus according to a yet further aspect of the invention comprises providing photo-detection means which comprises: a substrate having at least a surface thereof made of electrically insulative material; a light-excluding metal layer having light-passing holes formed therein, said lightexcluding metal layer formed on the substrate by means of vacuum vapor deposition method; a common electrode made of light-transmitting material, said common electrode formed on the light-excluding metal layer and on those portions of the substrate which are exposed to the light-passing holes of the light-excluding metal layer; a photoconductor formed on the common electrode; and individual electrodes formed on positions in the photoconductor corresponding to the light-passing holes of the light-excluding metal layer; and providing optical means for forming an image of an original document onto the photo-detection means.

Hence, according to the invention, there is provided a reading apparatus wherein not only the simplification of the producing process is effected, but also the reading picture elements with improved clarity is capable of accurately appearing without impairing the inherent quality of the photoconductor. Thus the present invention effectuates the reading apparatus of high quality and great functional reliability.

BRIEF DESCRIPTION OF THE DRAWINGS

These and other objects, features and advantages of the invention will become more apparent upon a reading of the following detailed specification and drawings, in which.

DETAILED DESCRIPTION OF THE PREFERRED EMBODIMENTS

Figure 1:
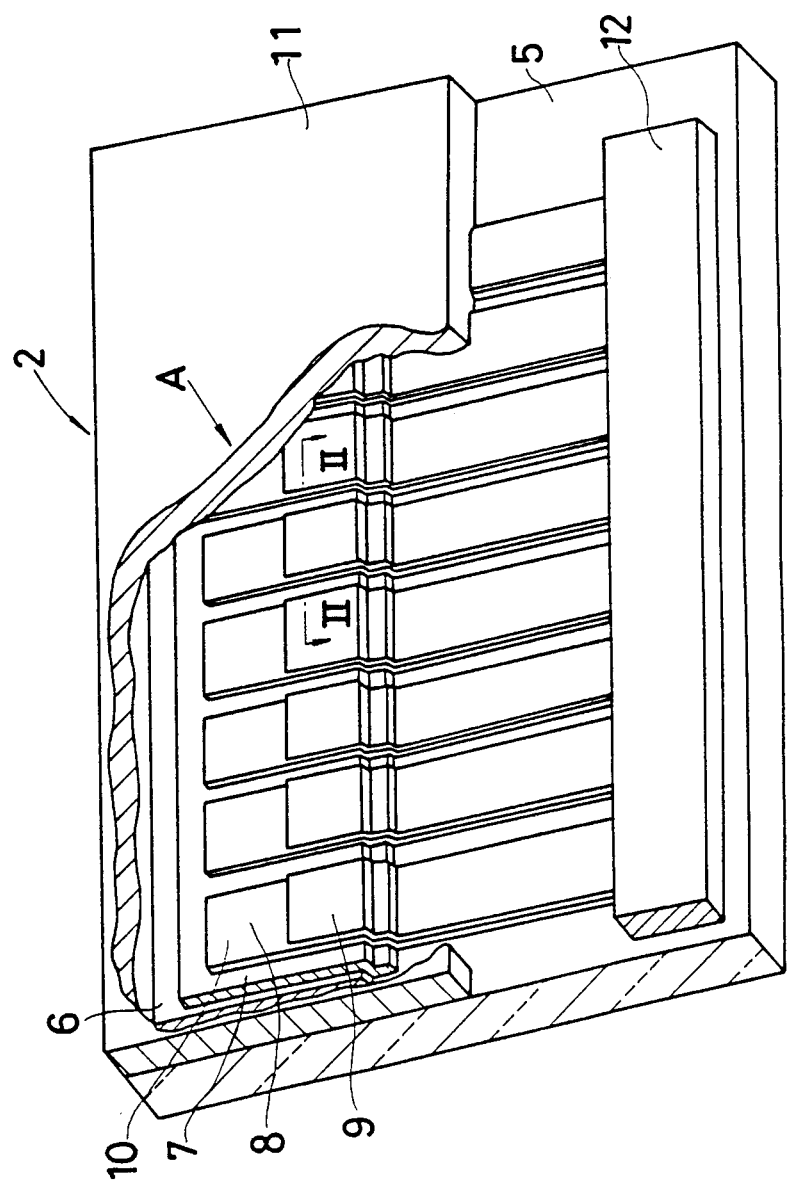
FIG. 1 is a perspective view showing the photo-detection part in the conventional reading apparatus of contact-type utilizing the focusing rod lense array as described above.
Figure 2:
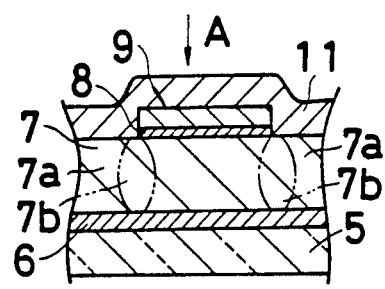
FIG. 2 is a partial cross section taken along the line II—II of FIG. 1.

Referring now to the drawings, preferred embodiments of the invention are described below.

Figure 4:
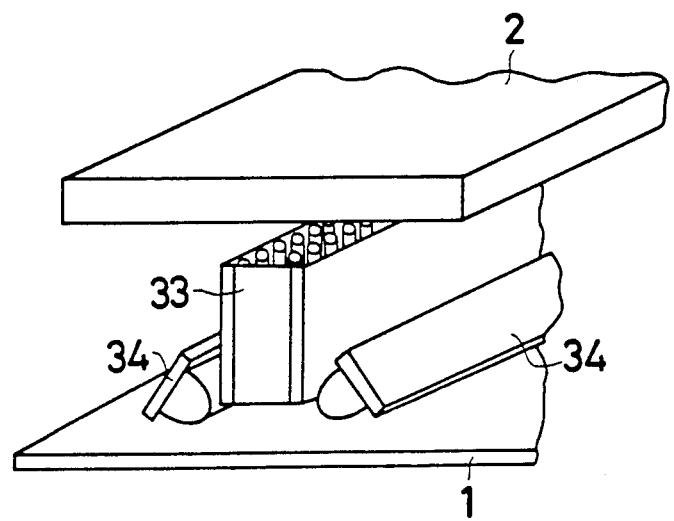
FIGS. 4 and 5 is schematic views showing reading systems of the reading apparatus of the invention.

For an image sensor of contact type, it has been proposed to present such a type as that detecting reflected light from an original document 1 via focusing rod lense array 33 as shown in FIG. 4. A photo-detection part 2 virtually corresponding to the original document 1 in a dimension of 1:1 is disposed in close proximity to the original document 1 via the focusing rod lense array 33. A light emitting diode 34 emits light to the original document 1. The reflected light passes through the focusing rod lense array 33 and is received by the photo-detection part 2.

Figure 5:
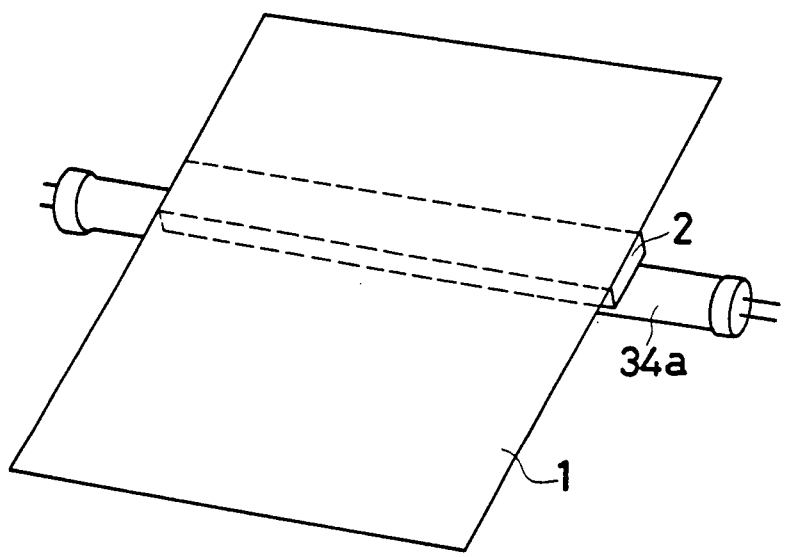

Besides, it has also been proposed to present another type performing detection by means of such a light source as a fluorescent 34a without this array 33 as shown in FIG. 5.

A circuit diagram for a photoelectric converter element array to be used in the photo-detection part has been already proposed in Japanese patent application No. 179801 of 1983 by the present applicant.

Figure 6:
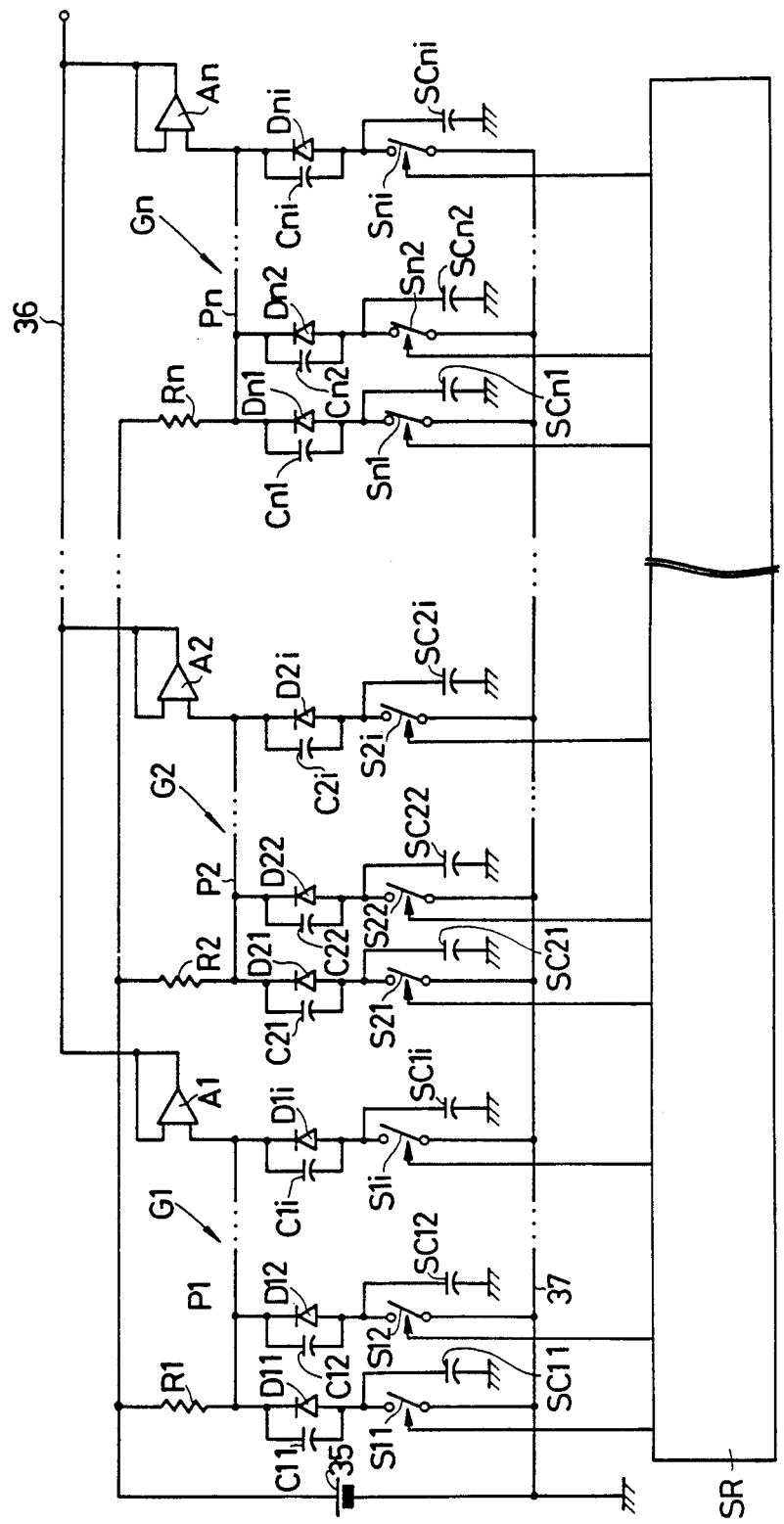
FIG. 6 is an electric circuit diagram of the invention.

Namely, FIG. 6 illustrates an electric circuit diagram of electric charge storage type. Photodiodes D11 to D1$i$, D21 to D2$i$, D31 to D3$i$, ..., Dn1 to Dn$i$ effected by amorphous silicon semiconductor or the like fall into a plurality of n groups G1 to Gn. The photodiodes D11 to D1$i$ are connected to a common electrode P1 in one group G1 among them. The common electrode P1 is connected to a bias power source 35 via a load resistance R1. The common electrode P1 is connected to a buffer amplifier A1 and applies a signal to a line 36. The photodiodes D11 to D1$i$ are connected to a line 37 via analog switches S11 to S1$i$. The line 37 is connected to the other terminal of the bias power source 35 and is earthed. The analog switches S11 to S1$i$ are connected to a shift register SR. Such arrangement of the group G1 is similarly applied to the other groups G2, G3, ..., Gn and therefore the similar explanation is omitted, giving like reference marks to corresponding parts. The analog switches S11 to S1$i$, S21 to S2$i$, S31 to S3$i$, ..., Sn1 to Sn$i$ are successively rendered conductive one at a time and scanned in time sequence by the shift register SR. That is, it is a single analog switch that is rendered conductive at a time. When the single switch is conductive, the other switches are non-conductive. The photodiodes D11 to D1$i$ have element parallel capacitance shown by storage capacitors C11 to C1$i$ respectively. Meanwhile the analog switches S11 to S1$i$ have input capacitance SC11 to SC1$i$ respectively. The other groups G2, G3, ... Gn are also similarly arranged.

Assumption is made that, for example the analog switch S11 is rendered conductive while the shift register SR successively renderes the analog switches S11 to Sn$i$ conductive and scans them. In this case, an electric current flows through the load resistance R1, the photodiode D11, and the analog switch S11 from the bias power source 35 when the photodiode D11 receives light. The voltage of the common electrode P1 corresponding to an amount of light received by the photodiode D11 is then delivered to the line 36 through the buffer amplifier A1. In this way the other photodiodes D12 to D1$i$ are similarly detected. Such detection is likewise executed for the rest of the groups G2, G3, ..., Gn.

When the analog switch S11 is rendered conductive and at the same time the photodiode D11 receives light, the electric charge of the storage capacitors C12 to C1$i$ connected in parallel with the other photodiodes D12 to D1$i$ and of the input capacitance SC12 to SC1$i$ of the other analog switches S12 to S1$i$ of the group G1 flows through the photodiode D11. Consequently, the value of the electric current flowing through the load resistance R1 from the bias power source 35 will be decreased in proportion to the amount of electric charge so flowing. In this circuitry, the photodiodes D11 to Dn$i$ fall into the plurality of n groups G1 to Gn. Accordingly, the number of the photodiodes belonging, for example, to the group G1 is the one $i$ which is substantially smaller than the number of the whole photodiodes, and the electric current which flows into the photodiode D11 receiving light, from the storage capacitors C12 to C1$i$ and the input capacitances SC12 to SC1$i$ at the time the analog switch S11 is rendered conductive is relatively small. Consequently, the decrease of the amount of the electric current flowing through the load resistance R1 can be inhibited, thereby permitting the improvement in the sensibility of the apparatus.

Figure 7:
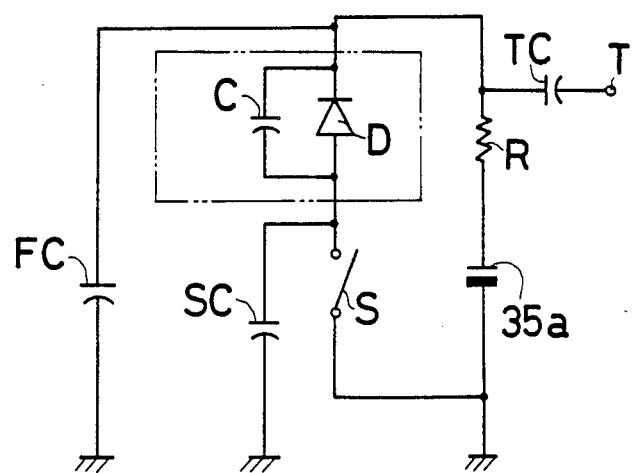
FIG. 7 is a fundamental electric circuit diagram of the electric circuit of an electric charge storage type photoelectric converter element array shown in FIG. 6.

FIG. 7 is a fundamental electric circuit diagram of the electric charge storage type reading system shown in FIG. 6. Bias voltage is applied to a storage capacitor C connected in parallel with a photodiode D by a bias power source 35a. A predetermined amount of electric charge is therefore stored therein. The photodiode D receives the reflected light from the original document, and electric charge stored in the storage capacitor C is then discharged correspondingly to the amount of photoelectric conversion by such light-reception. Thereafter, when the analog switch S is suitably closed, voltage produced at the load resistance R is sent to an output terminal T at the time the storage capacitor C is recharged. A light signal is thus detected. Besides, reference signal TC designates a coupling capacitor, and SC does capacitance of the analog switch S. Likewise reference sign FC designates equivalent stray capacitance of the switch. The stray capacitance FC increases with the increase of the number n of the electric converter elements as shown in FIG. 6. The stray capacitance FC can be expressed by the following equation:

$$FC = \frac{C1 \cdot SC}{C1 + S1} (n - 1) \qquad (1)$$

Where C1 is capacitance of the storage capacitor C.

Based upon the result of the experiment mentioned below, the present inventor has reached a new recognition that the value of C1 determined to be larger than that of SC leads to larger output to be produced so as to improve the degree of clarity or contrast of a reading image.

That is, in exercising the electric circuit shown in FIG. 6, the present inventor conducted an experiment, producing the following reading apparatus.

Figure 8:
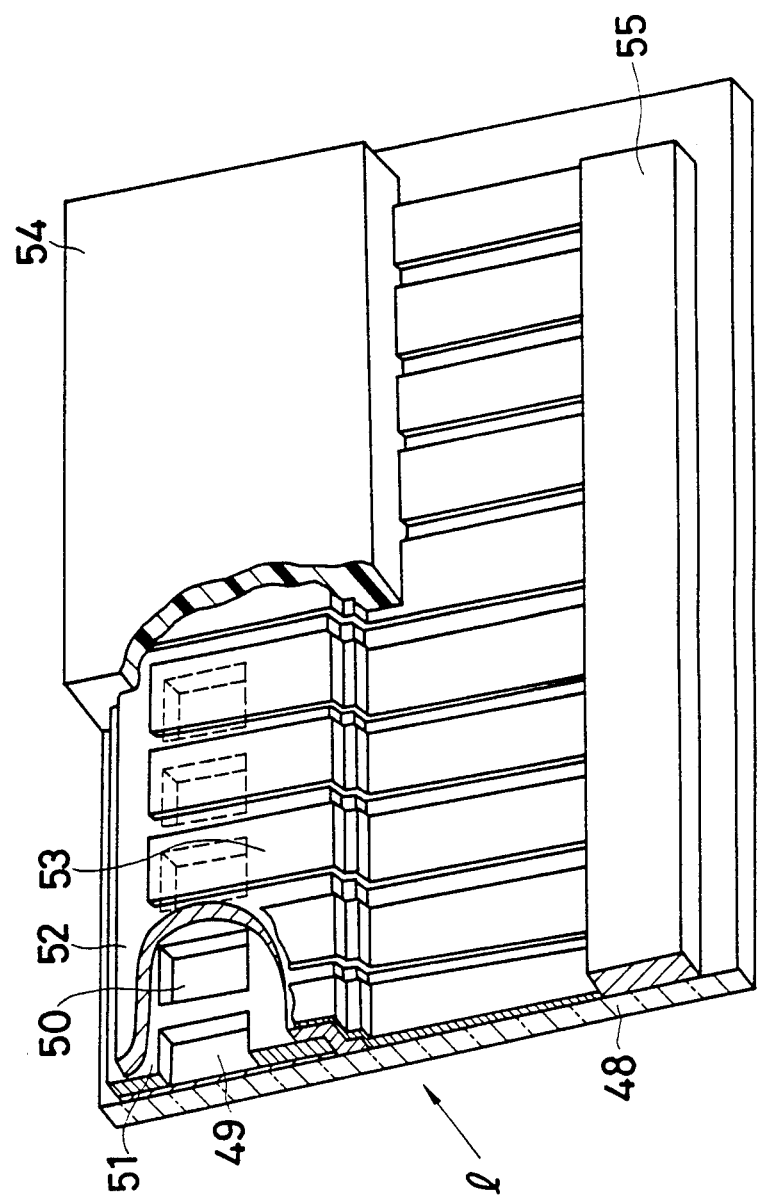
FIG. 8 is a perspective view showing an embodiment of the reading apparatus of the invention.

Namely, FIG. 8 shows the above-mentioned reading apparatus of the present invention which is concerned with the photo-detection part 2 shown in FIG. 4. On a light-transmitting substrate 48 made of glass or the like, there are formed a light-transmitting common electrode 49 made of for example ITO (tin-indium oxide) or the like to be electrically connected with one electrodes of the respective photoelectric converter elements, a light-excluding metal layer 51 made of, for example vapor-deposited metal of Al, Cr or the like and provided with light-passing holes 50 for passing therethrough the reflected light 1 from the original document 1, a photoconductor 52 made of amorphous silicon or the like, and individual electrodes 53 made of vapor-deposited metals of Al, Cr etc. and provided in the respective photoelectric converter elements, successively in this order. In addition, a protective layer 54 is so applied as to cover the light-transmitting common electrode 49, the light-excluding metal layer 51, and the individual electrodes 53. The protective layer 54 is not required to be transparent. The layer 54 is preferred to be so low with respect to light-transmittivity as to prevent entering of light into gaps among the individual electrodes 53, which would otherwise deteriorate the dissolution-capability of the reading picture elements. For material of the layer 54, relatively low-cost resin, for example silicon resin, epoxy resin, or the like may be utilized. Besides, reference sign 55 designates a drive circuit 55 such as a shift register SR.

According to the apparatus of the invention, the reflected light 1 from the original document 1 comes from the side of the light-transmitting substrate 48. The reflected light 1 passes through the light passing holes 50 corresponding to the respective photoelectric converter elements. Then the light 1 is converted into electricity in the photoconductor 52. Next, a reading signal is detected between the light-transmitting common electrode 49 and the individual electrodes 53.

Figure 9:
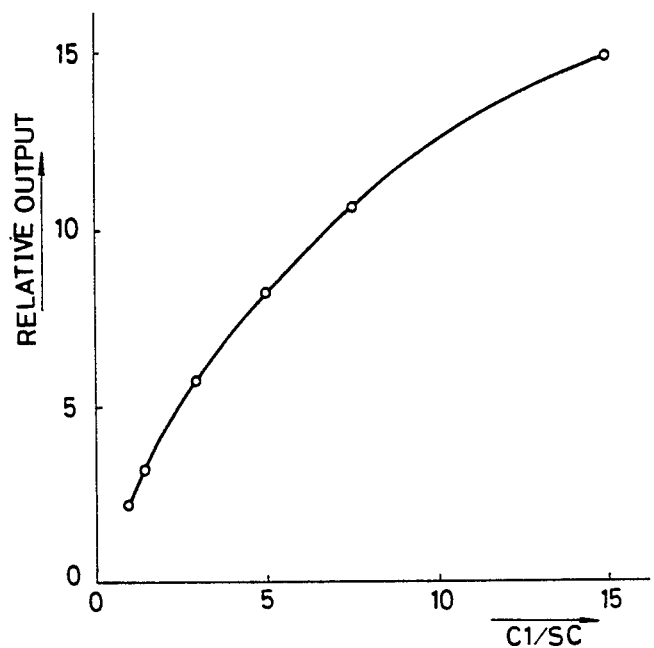
FIG. 9 is a diagrammatic view showing the relation between the relative output and the ratio of the capacitance C1 of the storage capacitor to the capacitance SC of the analog switch according to the embodiment of the invention.

The present inventor applied to electric circuit shown in FIG. 6 to the apparatus shown in FIG. 8, and measured the relative values of the output signals while varying the ratio of C1 to SC in the fundamental circuit of the respective photoelectric converter elements. Thus, the result shown in FIG. 9 was obtained. As apparent from FIG. 9, it can be readily said that the value of the relative output increases with the increase of the ratio of C1 to SC while changing the value of SC based upon the manner of IC with the value of C1 kept constant. This is because the value of the stray capacitance FC increases with the increase of the value of the capacitance SC, and accordingly an electric current flows into the storage capacitor C when the analog switch S is closed, and hence the amount of electric current flowing through the load resistance R decreases.

Furthermore, based upon the various experiments repeatedly conducted by the present inventor, it has been found that the capacitance SC of the switch S includes not only parasitic capacitance but also the combination of line capacitance of wiring pattern formed on the substrate.

The present inventor's elaborate and strenuous research in view of the aforementioned fact has proved that the output signal can be less affected by varying factors when the ratio of C1 to SC is determined to be substantially large.

Figure 10:
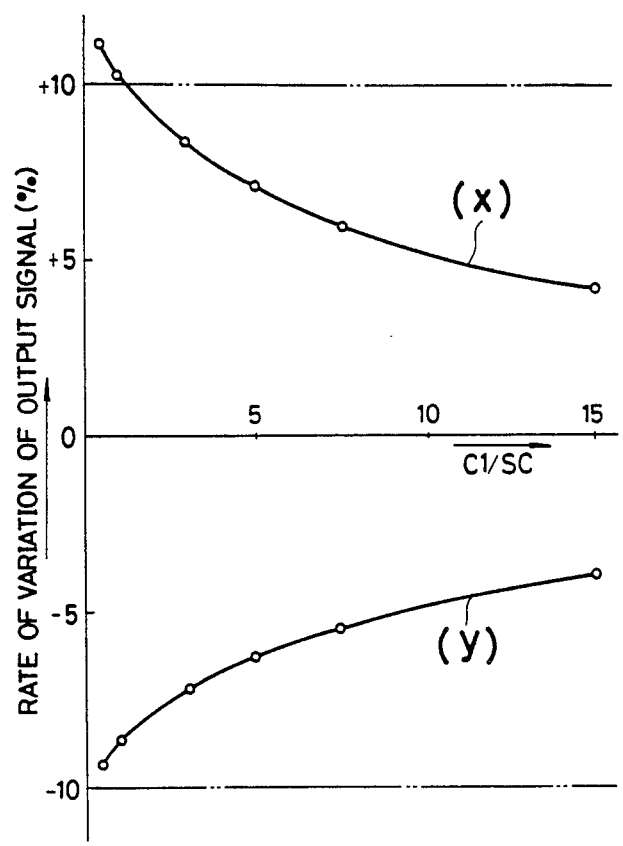
FIG. 10 is a diagrammatic view showing the relation between the rate of variation of the output signal and the ratio of the capacitance C1 of the storage capacitor to the capacitance SC of the analog switch according to the embodiment of the invention.

In FIG. 10, (x) shows the result obtained by plotting the amount of increse of the output signal above the average value of the output signals while changing the ratio of C1 to SC with the value of C1 kept constant, and (y) likewise shows the result obtained by plotting the amount of decrease of the output signal below the average value of the output signals with the value of C1 kept constant.

As apparent from FIG. 10, it has been proved that the rate of variation of the output signal can be fixed within the range of ±10% on condition that C1/SC>1. The reading apparatus adapted to be within such range is of no trouble in practical use whatsoever. It is apparent to be possible to reduce to a larger extent the rate of variation of the output signal caused by the non-uniformity of the capacitance C1 and the like, more preferably on condition that C1/SC>3.

Furthermore, the present invention is based upon another new recognition that the photoconductor 52 effected by amorphous silicon semiconductor formed on the common electrodes P1, P2 can serve as the photodiodes D11 to Dni.

Namely, amorphous silicon can be employed for the photoconductor to be formed on the common electrodes. Such employment of amorphous silicon (a-Si) as photoconductor assures that the ratio of Ip to Id can be the substantially large one, where Ip is a photo-current when light is emitted and Id is a dark current when light is not emitted. The present inventor's experiment has shown that the ratio of Ip to Id can be elevated to such a high value as $10^4$ order at the illumination intensity of 100 lx when the p-i-n junction is provided in the semiconductor.

The present invention is characterized in that such a-Si photoconductor is used for the storage capacitor. Moreover, the present invention is additionally characterized in that the electrode of the photoelectric converter part can fulfill the function of the electrode for the capacitor part, and that such electrode serves the common electrode.

When the common electrode is so formed, the area occupied by the electrode in which the a-Si photoconductor is disposed is larger than the area occupied by the light-reception part. Consequently, the dark current Id tends to be large necessarily. However, when the a-Si photoconductor is employed, the excellent ratio: $Ip/Id > 10^4$ can be attained, thereby removing any such possible inconvenience to the reading apparatus of the invention.

The following is an example of the experiment conducted by the present inventor.

For example, in the case where the amount of incident light is 100 lx or so, the most suitable capacitance of the storage capacitor is approximately 15 pF. Accordingly, S: electrode area (m$^2$) is determined by the following equation:

$$C1 = 8.854 \times 10^{-12} \times \frac{\epsilon_r \cdot S}{d} \quad (2)$$

where
  C1=capacitance of the storage capacitor C(F)
  $\epsilon_r$=specific dielectric constant of a-Si (approximately 11)
  S=electrode area (m$^2$)
  d=film thickness of the a-Si photoconductor (m)

The above electrode area S is the area defined by the confronting portions of the common electrode 49 and the individual electrodes 53.

Figure 11:
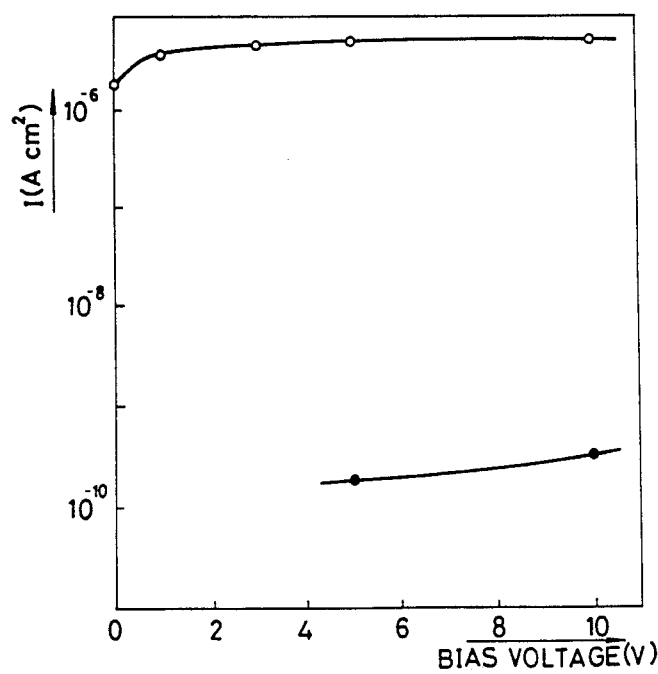
FIG. 11 is a diagrammatic view illustrating the ratio of photocurrent Ip to dark current Id according to the embodiment of the invention.

S is $2.3 \times 10^{-3}$ cm$^2$ when d is approximately 1.5 μm. When the area of the light-reception part is determined to be 100 μm×100 μm=$10^{-4}$ cm$^2$, the ratio of Ip to Id can be nevertheless thousandfold as shown in FIG. 11. Such value can be satisfactorily accepted as that required for the photoelectric converter apparatus. Furthermore, not only the present invention is based upon the recognition that the photodiode and the storage capacitor can be formed integrally when the a-Si photoconductor is utilized therefor, but also the present inventor who repeatedly conducted experiments has reached an absolutely unexpected recognition that various characteristics of each of the photodiode and the storage capacitor can be further effectively improved when the film thickness of such a-Si photoconductor is determined to be within the range of from 0.4 to 3.0 μm.

The above range of the film thickness of the a-Si photoconductor used as photodiode meets, for example, the requirement of the film thickness which is naturally demanded whenever the aforementioned p-i-n junction is applied. The best example of this fact is explained in that $d \approx 1.5$ μm according to the above equation (2).

Furthermore the present inventor has found that the storage capacitor whose film thickness is determined to be within such range is also practicable. Accordingly, the function of S to d is necessarily determined since the optimum capacitance of the photodiode is approximately 15 pF. For example in view of the fact that the reading element is 8 bit per millimeter with regard to the design criterion, the value of the area S cannot be freely chosen. Particularly, it has been found to be preferred that the minimum value of the area S, that is, the maximum value of the film thickness d be determined to be below 3.0 μm which will be of no trouble in practical use and will not decrease the production efficiency of the a-Si film. Meanwhile, when the thickness d is below 0.4 μm, the storage capacitor tends to be less practicable since the voltage resistance thereof is low substantially. Accordingly it has been acertained by the present inventor that the film thickness of the a-Si photoconductor may be suitably determined to be within the range of from 0.4 to 3.0 μm, more preferably from 1.0 to 2.0 μm.

Figure 12:
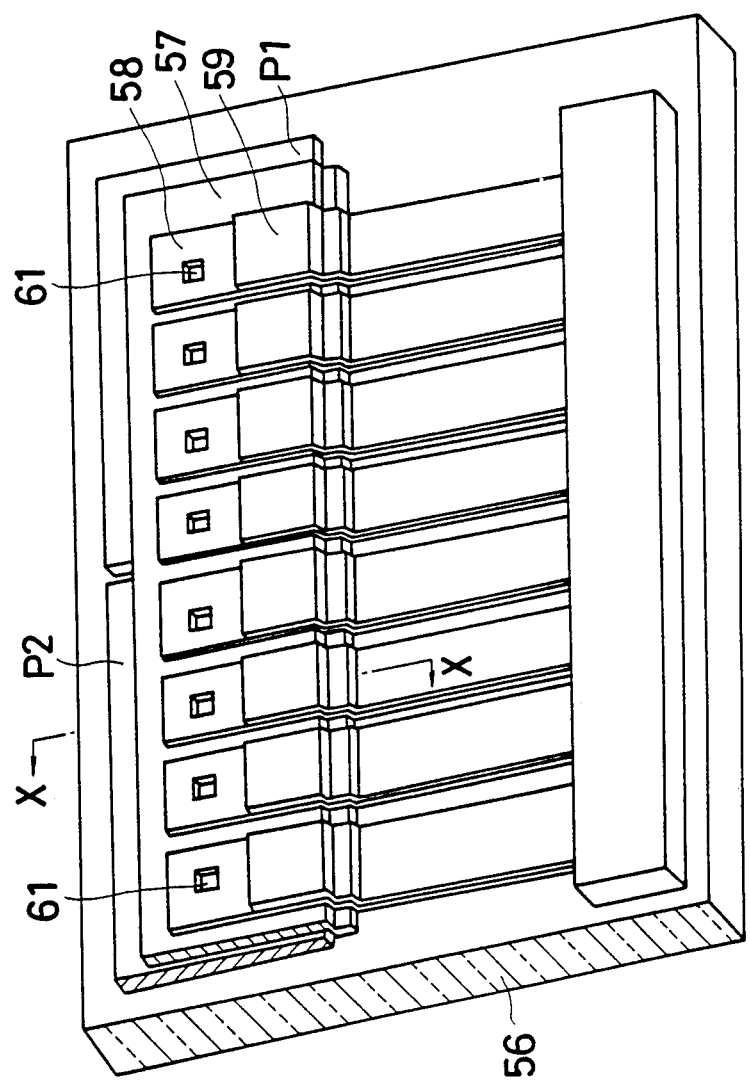
FIG. 12 is a perspective view showing a reading apparatus in another embodiment of the invention.
Figure 13:
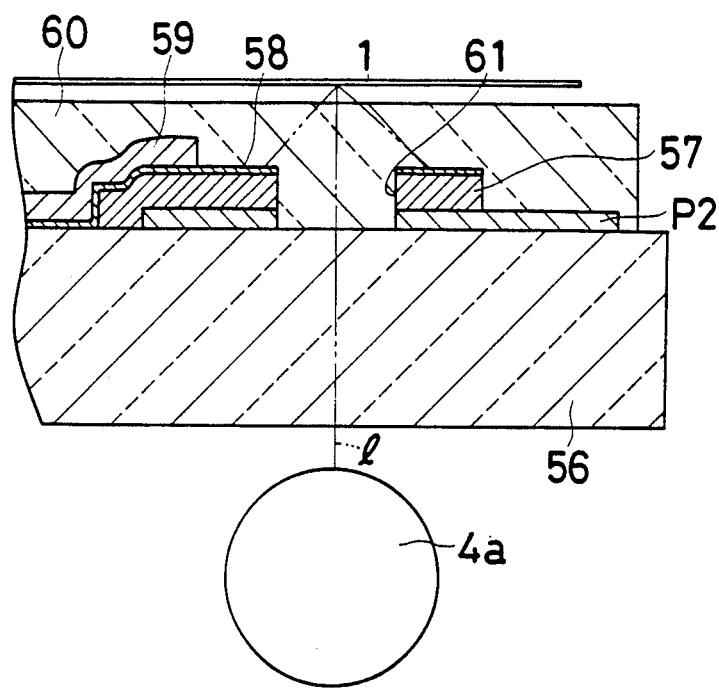
FIG. 13 is a cross section taken along the line X—X of FIG. 12.

The same result as above was obtained by the present inventor when the reading apparatus shown in FIGS. 12 and 13 is substituted for the apparatus shown in FIG. 8 in another embodiment of the invention.

FIGS. 12 and 13 show the photo-detection part used in reading system shown in FIG. 5. FIG. 13 shows a cross section taken along the line X—X of FIG. 12.

The common electrodes P1, P2 are formed at an interval on the substrate 56 made of light-transmitting transparent material such as glass. The common electrodes P1 and p2 are formed of vapor-deposited aluminum, chromium, and the like. The photoconductor 57 such as amorphous silicon semiconductor to constitute the photodiodes D11 to D1*i*, D21 to D2*i*, is formed on the common electrodes P1 and P2. Transparent electrodes 58 made of light-transmitting transparent material such as ITO (tin-indium oxide) are formed on the photoconductor 57 by means of sputtering or vacuum evaporation method. The transparent electrodes 58 are provided in the respective photodiodes D11 to Dni. The transparent electrodes 58 are connected with outgoing electrodes 59 individually. The outgoing electrodes 59 are formed of evaporated chromium. At the uppermost portion, there is formed a protective layer 60 made of light-transmitting transparent material such as glass. Light-passing holes 61 are formed in the common electrodes P1, P2, the photoconductor 57, and the transparent electrodes 58. Behind the substrate 56, a fluorescent lamp 4a is disposed as light source. Above the protective layer 60, the original document 1 is set. Light l is emitted to the original document 1 from the fluorescent lamp 4a through the substrate 56 and the protective layer 60. The reflected light from the original document 1 then passes through the transparent electrode 58 in the vicinity of the light passing hole 61. Next, the light l is received by the photoconductor 57.

Thus, the photodiodes D11 to Dni are formed in the vicinity of the light-passing holes 61. The light-passing holes 61 are disposed at intervals along the widthwise direction of the document 1, viz. along the axial direction of the fluorescent lamp 4a. On the substrate 56, there is disposed an integrated circuit such as shift register SR.

Furthermore, as apparent from the two types of reading apparatus shown in FIG. 8, and FIGS. 12 and 13, the present invention is based upon the new recognition that the photoconductor effected by the amorphous silicon semiconductor or the like formed on the common electrodes P1, p2 can be utilized not only as photodiodes D11 to Dni, but also as storage capasitors C11 to Cni.

Precisely, as aforementioned, the capacitance SC of the analog switch includes that combination of the line capacitance of the wiring pattern formed on the substrate which is one of varing factors of the output signal. Accordingly, the wiring number must be made as small as possible with a view to reduce the influence of the line capacitance. According to the invention, the photoconductor of the photodiode and the dielectric of the storage capacitor are integrally formed of the substantially same material, viz. the photoconductor, thereby making no use of leads required for connection between photodiode and the storage capacitor. Consequently, the line capacitance accompanied thereby is decreased so as to reduce the capacitance SC.

In addition, according to the present invention, the material having relatively high resistance is chosen for such photoconductor in order to increase the capacitance C1, which further facilitates to effectively achieve the objectives of the present invention. In the foregoing embodiment, is used the amorphous silicon photoconductor.

Thus, the use of amorphous silicon photoconductor for both the photodiodes D11 to Dni and the storage capacitors C11 to Cni accomplishes the increase of the ratio of C1 to SC, thereby attaining the high output signal to be produced with reduced variation.

Figure 14:
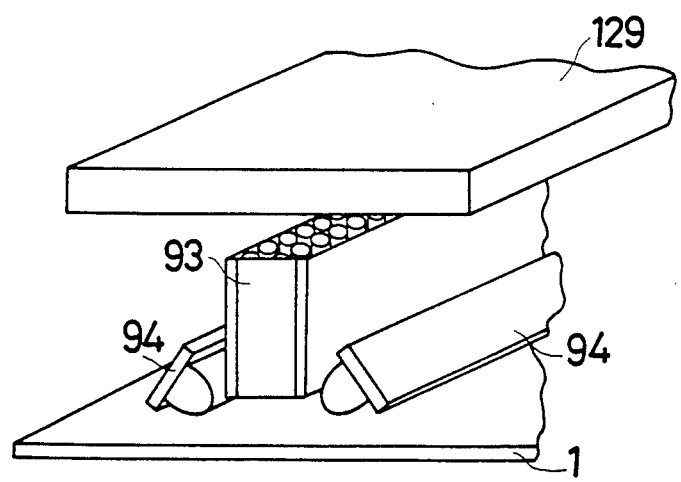
FIG. 14 is a schematic view showing a reading apparatus utilizing the focusing rod lense array which is provided with a photo-detection part according to the invention.

FIG. 14 schematically shows an arrangement of the reading system of contact-type using the focusing rod lense array and provided with photo-detection part 129 according to the present invention. The photo-detection part 129 virtually corresponding to the original document 1 in a dimension of 1:1 is disposed in close proximity to the original document 1 via the focusing rod lense array 93. LED 94 irradiates the original document 1 with light. The reflected light from the original document 1 passes through the rod lense array 93 and is received by the photo-detection part 129.

Figure 15:
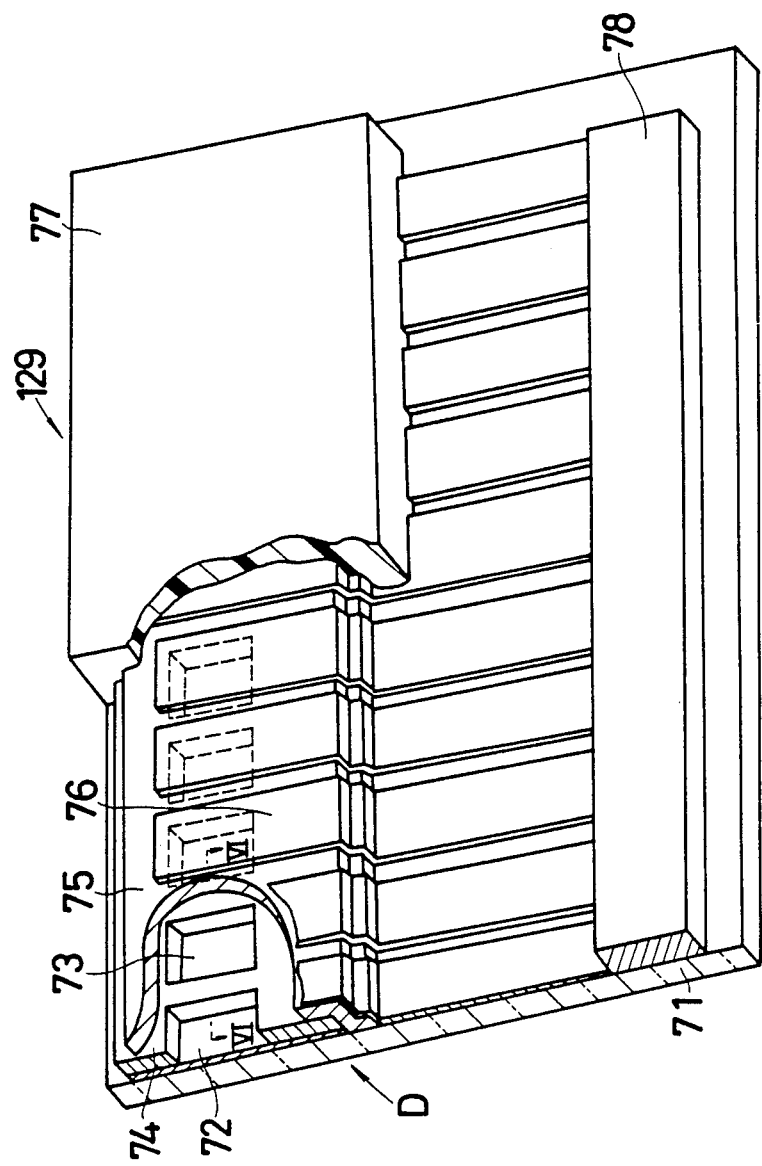
FIG. 15 is a perspective view showing the photo-detection part of FIG. 14.
Figure 16:
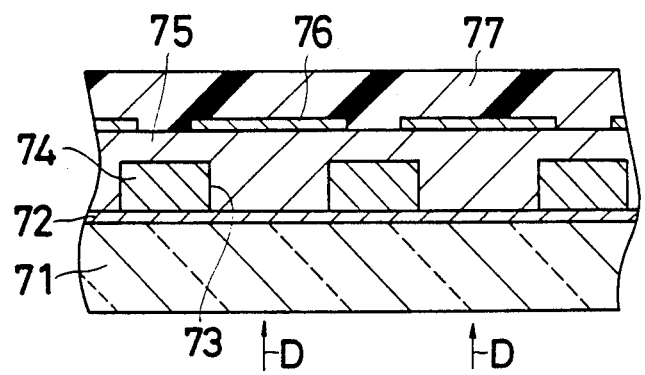
FIG. 16 is a cross section taken along the line VI—VI of FIG. 15.

FIG. 15 shows a perspective view of the photo-detection part 129 of FIG. 14. FIG. 16 is a cross section taken along the line VI—VI of FIG. 15. As shown in these FIGS. 15 and 16, on a substrate 71 having a surface thereof made of a light-transmitting electrically insulative material such as glass, there are formed a light-transmitting common electrode 72 made of, for example ITO (tin-indium oxide) or the like to be electrically connected with one electrodes of the respective photoelectric converter elements, a light-excluding metal layer 74 made of vapor-deposited metal of Al, Cr, or the like and provided with light-passing holes 73 for passing therethrough the reflected light D from the original document 1, a photoconductor 75 made of amorphous silicon, CdS etc, and individual electrodes 76 made of vapor-deposited metals of Al, Cr, and the like and provided in the respective photoelectric converter elements, successively in this order. Besides, the whole of substrate 71 may be made of light-transmitting electrically insulative material, or materials other than glass may be used therefor. In addition, a protective layer 77 is so applied as to cover the light-transmitting common electrode 72, the light-excluding metal layer 74, the individulal electrodes 76. The protective layer 77 is not required to be transparent. The layer 77 is preferred to be so low with respect to light-transmittivity as to prevent entering of light into gaps among the individual electrodes 76, which would otherwise deteriorate the dissolution-capability of the reading picture elements. For material of the layer 77, relatively low-cost resin, for example silicon resin, epoxy resin, or the like may be utilized. A drive circuit 78 such as a shift register is disposed on the substrate 71, and connected with the common electrode 72 and the individual electrodes 76, thereby enabling the reading operation.

According to the apparatus of the present invention, reflected light D from the original document 1 comes from the side of the light-transmitting substrate 71. The reflected light D passes through the light-passing holes 73 corresponding to the respective photoelectric converter elements. Then, the light D is converted into electricity in the photoconductor 75. Next, a reading signal is detected between the light-transmitting common electrode 72 and the individual electrodes 76.

According to the producing method of the reading apparatus of the invention, to form the five layers, i.e. the light-transmitting layer 72 through the protective layer 77 successively on the light-transmitting substrate 71, either of the light-transmitting common electrode 72 and the light-excluding metal layer 74 can be effected by means of vacuum vapor deposition method. Hence, the two layers 72 and 74 can be succeedingly formed by means of vacuum vapor deposition method to be commonly employed. In effect, accordingly, thin film forming apparatus required to form only four layers 72; 74; 75; 76; 77 may be employed, thereby achieving the improvement in producing efficiency such as reduction is required time for producing.

Besides, the photoconductor 75 is formed of amorphous silicon, CdS, or the like by means of glow discharging method as aforementioned, or may be formed of CdS by means of sputtering method, vacuum vapor deposition method, or chemical separating method. The individual electrodes 76 are formed of Al, Cr, and the like by means of vacuum vapor deposition method.

Further, the protective layer 77 made of resin or the like is then formed on the exposed portion of the photoconductor 75 by means of printing method or coating method. Thereafter, these layers are heated at 280° C. or lower to be hardened. Such relatively loose condition will not deteriorate, for example, the characteristic of the amorphous photoconductor 75, thus effecting the reading apparatus excellent in S/N ratio and of high quality.

According to the reading apparatus of the present invention, the reflected light D comes from the side of the light-transmitting substrate 71 and passes through the light-passing holes 73 formed in the respective photoelectric converter elements. Therefore the elements are irradiated with no extra light and the portions among the elements which are not utilized are not exposed. Accordingly, no leakage current to be accompanied by such light-irradiation will be produced.

Figure 3:
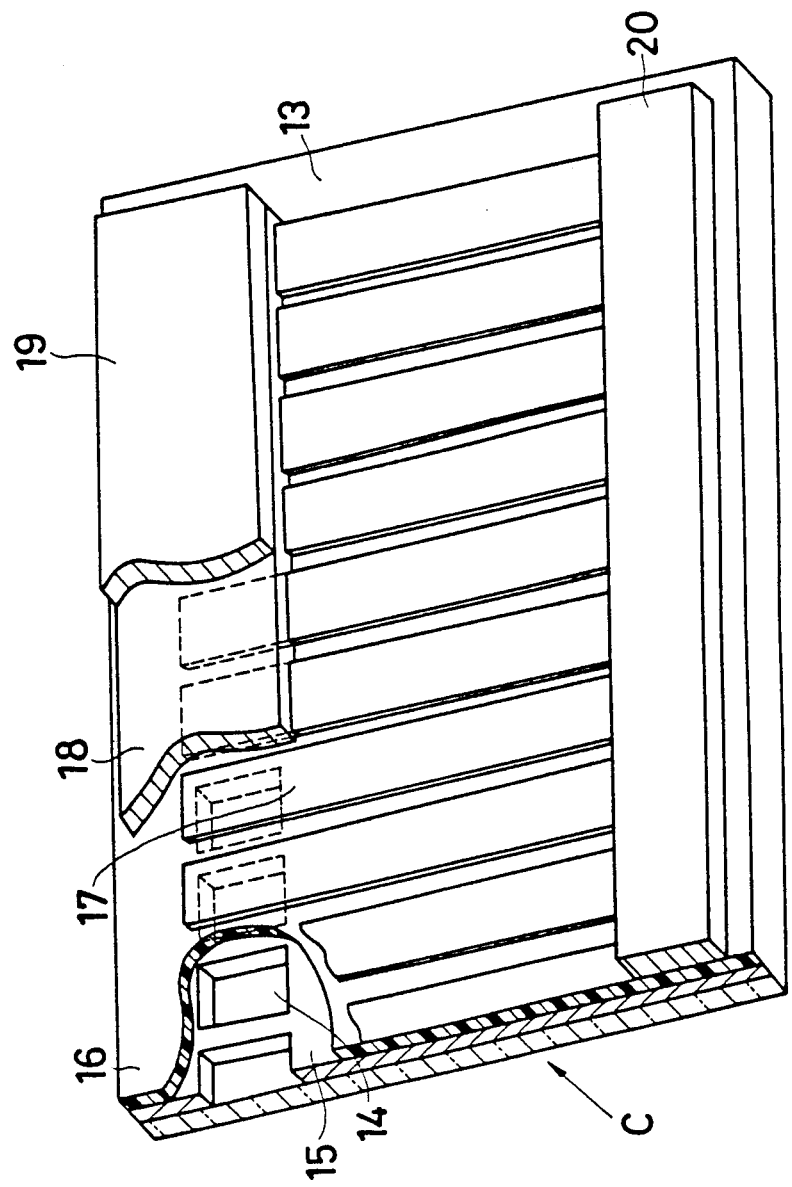
FIG. 3 is a perspective view of another conventional photo-detection part.

Moreover, it is apparent that there is no obstacle to the accurate reading of the elements in the apparatus as described with reference to FIG. 3 even if the pin-holes occur in the light-transmitting common electrodes 72 or the light-excluding metal layer 74.

According to the apparatus of the present invention, it is not necessary to form the light-transmitting common electrode 72 in a wide range since the light-excluding metal layer 74 is an electrical conductor. The common electrode 72 is electrically conductive with the light-excluding metal layer 74 as long as the common electrode 72 is larger than each light-passing hole 73. So there is no trouble.

Figure 17:
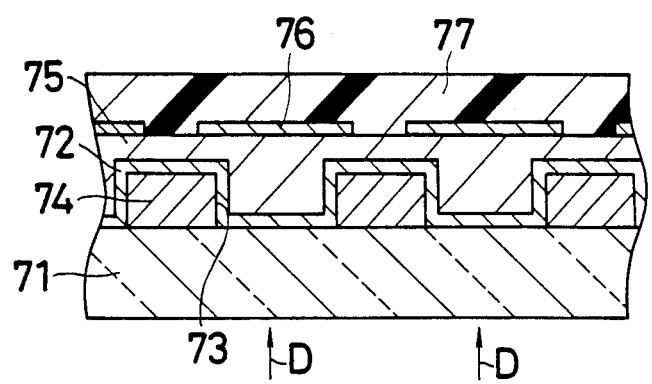
FIG. 17 is a cross sectional view of a photo-detection part of yet another embodiment according to the invention.

FIG. 17 is a sectional view showing another embodiment of the invention. This embodiment is similar to the foregoing embodiment. Like reference marks are assigned to corresponding parts. What is of note in this embodiment shown in FIG. 17 is that the formation of the light-transmitting common electrode 72 and the light-excluding metal layer 74 is effected in the order reverse to the embodiment shown in FIGS. 15 and 16. Namely, first the light-excluding metal layer 74 is formed on the light-transmitting substrate 71. The light-transmitting common electrode 72 is then formed thereon. The construction and producing process of this embodiment except for the above are the same as the foregoing embodiment with reference to FIGS. 15 and 16.

In still another embodiment of the invention, the reflected light D from the original document may come from the side of the protective layer 77.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A reading apparatus comprising:
   photo-detection means for detecting incident light, said photo-detection means comprising:
   a substrate having at least a surface thereof made of light-transmitting and electrically insulative material;
   a common electrode made of light-transmitting material and formed on the substrate; p1 a light-excluding metal layer made of light-excluding material, formed on the common electrode, and defining a plurality of light-passing holes formed therein such that the light-passing holes are arranged in one direction to adjoin to each other;
   a photoconductor formed on the light-excluding metal layer and on those portions of the common electrode which face the light-passing holes of the light-excluding metal layer; and
   a plurality of individual electrodes so formed on the photo-conductor as to respectively correspond to the light-passing holes of the light-excluding metal layer; and
   optical means for forming an image of an original document onto the substrate.

2. A reading apparatus comprising:
   photo-detection means for detecting incident light, said photo-detection means comprising:

a substrate having at least a surface thereof made of light-transmitting and electrically insulative material;

a light-excluding metal layer made of light-excluding material, formed on the substrate, and defining a plurality of light-passing holes formed therein such that the light-passing holes are arranged in one direction to adjoin to each other;

a common electrode made of light-transmitting material, and formed on the light-excluding metal layer and on those portions of the substrate which face the light-passing holes of the light-excluding metal layer;

a photo-conductor formed on the common electrode; and a plurality of individual electrodes so formed on the photoconductor as to respectively correspond to the light-passing holes of the light-excluding metal layer; and optical means for forming an image of an original document onto the substrate.

3. A reading apparatus as claimed in claim 1 or 2, wherein a protective layer is formed on the individual electrodes and on those portions of the photoconductor on which the individual electrodes are not formed.

4. A reading apparatus as claimed in claim 1 or 2, wherein the substrate is made of a material which comprises glass.

5. A reading apparatus as claimed in claim 1 or 2, wherein the common electrode is made of a material comprising ITO (tin-indium oxide).

6. A reading apparatus as claimed in claim 1 or 2, wherein the light-excluding metal layer is made of one selected from the group comprising Al and Cr.

7. A reading apparatus as claimed in claim 1 or 2, wherein the photoconductor is made of one selected from the group comprising amorphous silicon and CdS.

8. A reading apparatus as claimed in claim 1 or 2, wherein the individual electrodes are made of at least one selected from the group comprising Al and Cr.

9. A reading apparatus as claimed in claim 1 or 2, wherein the protective layer comprises synthetic resin material.

10. A method of producing a reading apparatus which comprises:

providing photo-detection means for detecting incident light which comprises:

a substrate having at least a surface thereof made of light-transmitting and electrically insulative material;

a common electrode made of light-transmitting material, said common electrode formed on the surface;

a light-excluding metal layer having a plurality of light-passing holes formed therein, said light-excluding metal layer formed on the common electrode by means of vacuum vapor deposition method;

a photoconductor formed on the light-excluding metal layer and on those portions of the common electrode which are exposed to the light-passing holes of the light-excluding metal layer; and a plurality of individual electrodes formed on positions in the photoconductor corresponding to the light-passing holes of the light-excluding metal layer; and providing optical means for forming an image of an original document onto the photo-detection means.

11. A method of producing a reading apparatus which comprises:

providing photo-detection means for detecting incident light which comprises:

a substrate having at least a surface thereof made of light-transmitting and electrically insulative material;

a light-excluding metal layer defining light-passing holes formed therein, said light-excluding metal layer formed on the substrate by means of vacuum vapor deposition method;

a common electrode made of light-transmitting material, said common electrode formed on the light-excluding metal layer and on those portions of the substrate which are exposed to a plurality of light-passing holes of the light-excluding metal layer;

a photoconductor formed on the common electrode; and a plurality of individual electrodes formed on positions in the photoconductor corresponding to the light-passing holes of the light-excluding metal layer; and providing optical means for forming an image of an original document onto the photo-detection means.

12. A method of producing a photo-detector for a reading apparatus comprising the steps of:

forming a substrate of light-transmitting and electrically insulative material;

forming a common electrode of light-transmitting material on the substrate by vacuum vapor deposition;

forming a light-excluding metal layer by vacuum vapor deposition on the common electrode, said light-excluding metal layer defining a plurality of light-passing holes formed therein;

forming a photoconductor on the light-excluding metal layer and on those portions of the common electrode which are exposed by the light-passing holes of the light-excluding metal layer; and forming a plurality of individual electrodes on the photoconductor in positions corresponding to the light-passing holes of the light-excluding metal layer.

13. A method of producing a photo-detector for a reading apparatus comprising the steps of:

forming a substrate of light-transmitting and electrically insulative material;

forming a light-excluding metal layer by vacuum vapor deposition on the common electrode, said light-excluding metal layer defining a plurality of light-passing holes formed therein;

forming a common electrode of light-transmitting material on the light-excluding metal layer and on those portions of the substrate which are exposed by a plurality of light-passing holes of the light-excluding metal layer;

forming a photoconductor on the common electrode; and forming a plurality of individual electrodes on the photoconductor in positions corresponding to the light-passing holes of the light-excluding metal layer.

* * * * *